United States Patent
Amirkhany et al.

(10) Patent No.: US 10,699,669 B2
(45) Date of Patent: Jun. 30, 2020

(54) METHOD AND APPARATUS FOR DUTY-CYCLE CORRECTION IN A SERIAL DATA TRANSMITTER

(71) Applicant: Samsung Display Co., Ltd., Yongin-si, Gyeonggi-do (KR)

(72) Inventors: Amir Amirkhany, Sunnyvale, CA (US); Mohammad Hekmat, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/057,037

(22) Filed: Aug. 7, 2018

(65) Prior Publication Data

US 2019/0272804 A1 Sep. 5, 2019

Related U.S. Application Data

(60) Provisional application No. 62/638,043, filed on Mar. 2, 2018.

(51) Int. Cl.
*G09G 5/00* (2006.01)
*H03K 3/017* (2006.01)
*H03K 21/38* (2006.01)

(52) U.S. Cl.
CPC .......... *G09G 5/008* (2013.01); *H03K 3/017* (2013.01); *H03K 21/38* (2013.01)

(58) Field of Classification Search
CPC .......... G09G 5/24; G09G 5/008; H03K 3/017; H03K 3/02; H04L 1/00; H04L 1/0001; H04L 1/0033; H04L 1/0036; H04L 7/0091

USPC ....................... 345/76–83, 87–104
See application file for complete search history.

(56) References Cited

U.S. PATENT DOCUMENTS

| | | | |
|---|---|---|---|
| 6,960,952 B2 | 11/2005 | Nguyen et al. |
| 7,005,904 B2 | 2/2006 | Minzoni |
| 7,668,698 B2 | 2/2010 | Jiang |
| 7,688,928 B2 | 3/2010 | Lin et al. |
| 7,898,309 B1 | 3/2011 | Dogan |
| 8,063,680 B2 | 11/2011 | Choi |

(Continued)

OTHER PUBLICATIONS

Chung, Ching-Che, "High-Resolution All-Digital Duty-Cycle Corrector in 65-nm CMOS Technology", IEEE, (VLSI), vol. 22, May 2014, pp. 1096-1105.

*Primary Examiner* — Alexander Eisen
*Assistant Examiner* — Nelson Lam
(74) *Attorney, Agent, or Firm* — Lewis Roca Rothgerber Christie LLP

(57) ABSTRACT

A circuit for duty cycle detection and correction, for a serial data transmitter. The circuit includes a pattern generator having a pattern data output configured to be selectively connected to the data input of the serial data transmitter, and a duty cycle detection circuit, connected to the output of the serial data transmitter. The pattern generator is configured to produce a pattern including a sequence including an odd number of consecutive zeros and a same number of consecutive ones. The duty cycle detection circuit is configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

20 Claims, 5 Drawing Sheets

(56) References Cited

U.S. PATENT DOCUMENTS

| | | |
|---|---|---|
| 8,125,259 B2 | 2/2012 | Dai et al. |
| 8,179,952 B2 | 5/2012 | Thurston et al. |
| 8,416,001 B2 | 4/2013 | Ding et al. |
| 9,048,823 B2 | 6/2015 | Bui et al. |
| 9,071,237 B2 | 6/2015 | Lee et al. |
| 9,369,263 B1 | 6/2016 | Baecher et al. |
| 9,413,339 B2 | 8/2016 | Amirkhany et al. |
| 9,571,311 B2 * | 2/2017 | Amirkhany .......... H04L 25/0292 |
| 10,256,784 B2 * | 4/2019 | Malhotra ................ H04B 1/16 |
| 10,401,391 B1 * | 9/2019 | Wei ........................ H03F 3/387 |
| 2002/0051511 A1 * | 5/2002 | Kataoka ................. G09G 5/006 |
| | | 375/376 |
| 2006/0103441 A1 * | 5/2006 | Carpenter ............ H03K 5/1565 |
| | | 327/175 |
| 2008/0111604 A1 * | 5/2008 | Boerstler ................ G06F 1/10 |
| | | 327/175 |
| 2009/0290626 A1 * | 11/2009 | Thurston .......... G01R 31/31715 |
| | | 375/224 |
| 2011/0001527 A1 | 1/2011 | Lee |
| 2011/0163789 A1 | 7/2011 | Na et al. |
| 2011/0320851 A1 * | 12/2011 | Bunce .................... G11C 11/419 |
| | | 713/401 |
| 2012/0179422 A1 * | 7/2012 | Webb, III ........ G01R 31/31725 |
| | | 702/187 |
| 2014/0169416 A1 * | 6/2014 | Liu ..................... H04L 25/0292 |
| | | 375/219 |
| 2014/0253195 A1 * | 9/2014 | Chandrasekaran .. H03K 5/1565 |
| | | 327/175 |
| 2015/0097603 A1 * | 4/2015 | Amirkhany .......... H03K 5/1565 |
| | | 327/155 |
| 2016/0149732 A1 * | 5/2016 | Amirkhany .......... H04L 25/0292 |
| | | 375/233 |
| 2016/0241249 A1 | 8/2016 | Balamurugan et al. |
| 2016/0343418 A1 | 11/2016 | Giovannini et al. |
| 2017/0126220 A1 | 5/2017 | Elbadry |
| 2017/0163410 A1 * | 6/2017 | Rommel ............. G06F 13/4282 |
| 2018/0364752 A1 * | 12/2018 | Li ............................. G06F 1/08 |
| 2019/0215146 A1 * | 7/2019 | Ke ........................... H03K 7/08 |

* cited by examiner

METHOD AND APPARATUS FOR DUTY-CYCLE CORRECTION IN A SERIAL DATA TRANSMITTER

CROSS-REFERENCE TO RELATED APPLICATION(S)

The present application claims priority to and the benefit of U.S. Provisional Application No. 62/638,043, filed Mar. 2, 2018, entitled "METHOD AND APPARATUS FOR DUTY-CYCLE CORRECTION OF HIGH SPEED I/O", the entire content of which is incorporated herein by reference.

FIELD

One or more aspects of embodiments according to the present invention relate to serial data transmitters, and more particularly to a system and method for correcting duty cycle in a serial data transmitter.

BACKGROUND

In high-performance high-speed links, lane deterministic jitter (DJ) due to clock duty-cycle distortion (DCD) may be a significant fraction of the total lane deterministic jitter. In low-power high-performance links, due to the small size of the I/O driver circuits, systems and methods of calibration may be important for meeting duty-cycle distortion specifications. A large portion of deterministic jitter in a serial data transmitter may be caused by duty-cycle distortion (DCD) of the double data rate clock, and the mismatch in the output multiplexer (OMUX).

Thus, there is a need for a system and method for reducing duty-cycle distortion in a serial data transmitter.

SUMMARY

According to an embodiment of the present disclosure there is provided a circuit, including: a serial data transmitter having a data input, a clock input, and an output; a pattern generator having a pattern data output configured to be selectively connected to the data input of the serial data transmitter; and a duty cycle detection circuit, connected to the output of the serial data transmitter, the pattern generator being configured to produce a pattern including a sequence including an odd number of consecutive zeros and a same number of consecutive ones, the serial data transmitter being configured to transmit, during each half cycle of a double data rate clock received at the clock input of the serial transmitter, a respective bit received at the data input of the serial transmitter, and the duty cycle detection circuit being configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

In one embodiment, the duty cycle detection circuit has a clock input and includes: a capacitor; a switched charge pump; and a clocked comparator, the switched charge pump being configured: to charge the capacitor when the output of the serial data transmitter is in a first state and to discharge the capacitor when the output of the serial data transmitter is in a second state, the clocked comparator being configured to compare a voltage on the capacitor and a reference voltage, at a sampling time defined by a transition in a clock signal at the clock input of the duty cycle detection circuit.

In one embodiment, the circuit includes a multiplexer having a first input, a second input, and an output, wherein the pattern generator is connected to the first input of the multiplexer, and the serial data transmitter is connected to the output of the multiplexer.

In one embodiment, the circuit includes a duty cycle correction circuit having an adjusted clock output connected to the clock input of the serial data transmitter, the duty cycle correction circuit being configured: to receive: a clock signal, and a duty cycle correction code; and to produce, at the adjusted clock output, an adjusted clock signal, the adjusted clock signal having a duty cycle adjusted according to the duty cycle correction code.

In one embodiment, the circuit includes a finite state machine circuit, configured: to reset the duty cycle detection circuit; to set the multiplexer to connect the pattern generator to the data input of the serial data transmitter; to command the pattern generator to generate a first pattern; and to generate a first duty cycle correction code based on one or more bits received from the duty cycle detection circuit.

In one embodiment, the finite state machine circuit includes a counter configured: to count up when a bit received from the duty cycle detection circuit has a first value, and to count down when a bit received from the duty cycle detection circuit has a second value, different from the first value.

In one embodiment, the finite state machine circuit is further configured: to command the pattern generator to generate a second pattern; to generate a second duty cycle correction code based on one or more bits received from the duty cycle detection circuit; and to feed, to the duty cycle correction circuit, a third duty cycle correction code, the third duty cycle correction code being an average of: the first duty cycle correction code, and the second duty cycle correction code.

In one embodiment, the duty cycle correction circuit includes an inverter having a programmable pull-up strength or a programmable pull-down strength.

According to an embodiment of the present disclosure there is provided a circuit, including: a serial data transmitter having a data input, a clock input, and an output; a clock source; and a duty cycle detection and correction circuit including a pattern generator configured to produce a pattern including a sequence including an odd number of consecutive zeros and a same number of consecutive ones, the serial data transmitter being configured to transmit, during each half cycle of a double data rate clock received at the clock input of the serial transmitter, a respective bit received at the data input of the serial transmitter, the duty cycle detection and correction circuit being configured: to estimate, from a signal at the output of the serial data transmitter when the pattern is fed to the data input of the serial data transmitter, an error in a duty cycle of a clock embedded in the signal at the output of the serial data transmitter, and to form an adjusted clock signal from a clock signal produced by the clock source, the adjusted clock signal having a duty cycle adjusted to reduce the error.

In one embodiment, the duty cycle detection and correction circuit further includes a duty cycle detection circuit connected to the output of the serial data transmitter, and the pattern generator has a pattern data output configured to be selectively connected to the data input of the serial data transmitter; and the duty cycle detection circuit is configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

In one embodiment, the duty cycle detection circuit has a clock input and includes: a capacitor; a switched charge pump; and a clocked comparator, the switched charge pump being configured: to charge the capacitor when the output of the serial data transmitter is in a first state and to discharge the capacitor when the output of the serial data transmitter is in a second state, the clocked comparator being configured to compare a voltage on the capacitor and a reference voltage, at a sampling time defined by a transition in a clock signal at the clock input of the duty cycle detection circuit.

In one embodiment, the circuit includes a multiplexer having a first input, a second input, and an output, wherein the pattern generator is connected to the first input of the multiplexer, and the serial data transmitter is connected to the output of the multiplexer.

In one embodiment, the circuit includes a duty cycle correction circuit having an adjusted clock output connected to the clock input of the serial data transmitter, the duty cycle correction circuit being configured: to receive: a clock signal, and a duty cycle correction code; and to produce, at the adjusted clock output, an adjusted clock signal, the adjusted clock signal having a duty cycle adjusted according to the duty cycle correction code.

In one embodiment, the circuit includes a finite state machine circuit, configured: to reset the duty cycle detection circuit; to set the multiplexer to connect the pattern generator to the data input of the serial data transmitter; to command the pattern generator to generate a first pattern; and to generate a first duty cycle correction code based on one or more bits received from the duty cycle detection circuit.

In one embodiment, the finite state machine circuit includes a counter configured: to count up when a bit received from the duty cycle detection circuit has a first value, and to count down when a bit received from the duty cycle detection circuit has a second value, different from the first value.

In one embodiment, the finite state machine circuit is further configured: to command the pattern generator to generate a first pattern; to generate a second duty cycle correction code based on one or more bits received from the duty cycle detection circuit; and to feed, to the duty cycle correction circuit, a third duty cycle correction code, the third duty cycle correction code being an average of: the first duty cycle correction code, and the second duty cycle correction code.

In one embodiment, the duty cycle correction circuit includes an inverter having a programmable pull-up strength or a programmable pull-down strength.

According to an embodiment of the present disclosure there is provided a display, including: a driver integrated circuit including a serial data receiver; and a timing controller including: a serial data transmitter having a data input, a clock input, and an output; a pattern generator having a pattern data output configured to be selectively connected to the data input of the serial data transmitter; and a duty cycle detection circuit, connected to the output of the serial data transmitter, the serial data transmitter being configured to transmit, during each half cycle of a double data rate clock received at the clock input of the serial transmitter, a respective bit received at the data input of the serial transmitter, the pattern generator being configured to produce a pattern including a sequence including an odd number of consecutive zeros and a same number of consecutive ones, and the duty cycle detection circuit being configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

In one embodiment, the duty cycle detection circuit has a clock input and includes: a capacitor; a switched charge pump; and a clocked comparator, the switched charge pump being configured: to charge the capacitor when the output of the serial data transmitter is in a first state and to discharge the capacitor when the output of the serial data transmitter is in a second state, the clocked comparator being configured to compare a voltage on the capacitor and a reference voltage, at a sampling time defined by a transition in a clock signal at the clock input of the duty cycle detection circuit.

In one embodiment, the display includes a multiplexer having a first input, a second input, and an output, wherein the pattern generator is connected to the first input of the multiplexer, and the serial data transmitter is connected to the output of the multiplexer.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a method and apparatus for duty-cycle correction of high speed I/O provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
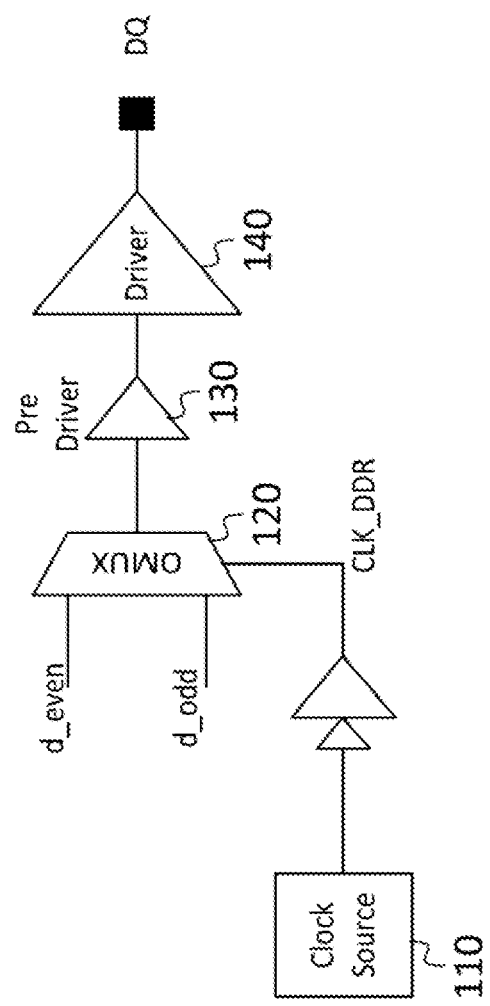
FIG. 1 is a block diagram of a serial data transmitter, according to an embodiment of the present invention.

Referring to FIG. 1, in some embodiments a double data rate serial data transmitter includes a clock source 110, an output multiplexer (OMUX) 120, a pre-driver amplifier 130 and a driver amplifier 140. One bit of data may be clocked out with each half-cycle of the clock, which alternately selects between the even and odd inputs of the OMUX 120. Such a circuit may be designed to operate at or near the greatest operating speeds achievable by the process used to fabricate the integrated circuit, and, as such, even small imperfections in the effective duty cycle of the clock may be of importance, and may degrade the performance of the serial link.

Figure 2A:
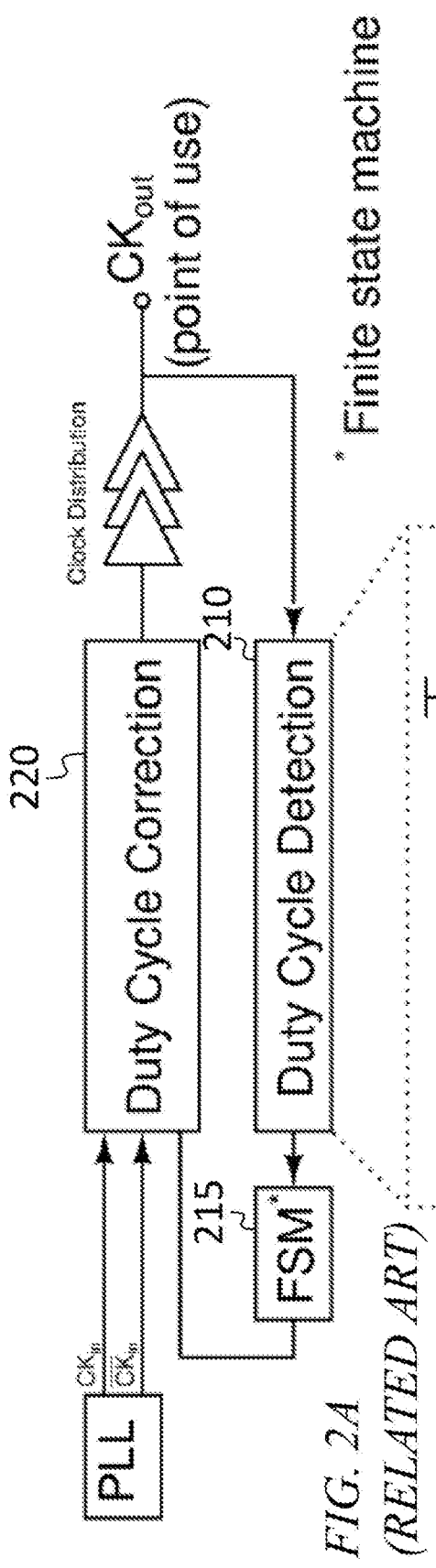
FIG. 2A is a block diagram of a system for duty cycle detection and correction, according to related art embodiment.
Figure 2B:
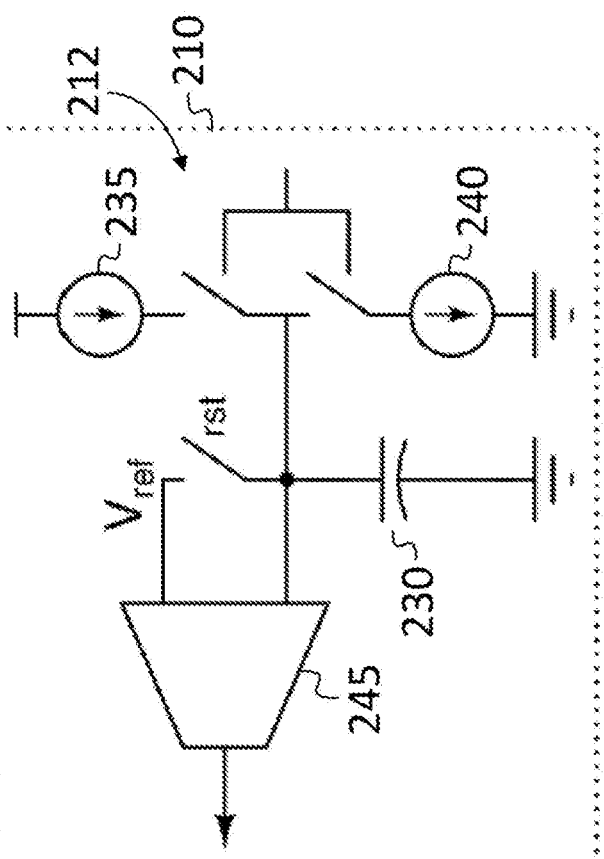
FIG. 2B is a schematic diagram of a duty cycle detection circuit, according to an embodiment of the present invention.

Referring to FIG. 2A, in some embodiments a system for reducing duty-cycle distortion in a serial data transmitter includes a duty cycle detection circuit 210 for detecting duty cycle errors in the clock embedded in the output serial data stream, a finite state machine 215, and a duty cycle correction circuit 220, discussed in further detail below. The duty cycle detection circuit may include a switched charge pump 212, as illustrated in FIG. 2B. The switched charge pump 212 may have a ganged switch controlled by the input (connected to the output of the serial data transmitter) and be configured to charge a capacitor 230 with current from a first current source 235 when the output of the serial data transmitter (and, therefore, the switch) is in a first state, and to discharge the capacitor 230 through a second current source 240 when the output of the serial data transmitter (and, therefore, the switch) is in a second state. The output $CK_{out}$ (or "DQ" in FIGS. 1 and 3) of the serial data transmitter is the actual point of use, and it may be well suited as a point for detecting duty cycle distortion, because it may capture aggregate distortion from several mechanisms, and introduced at several different points, in the serial data transmitter.

A clocked comparator 245 (or "sampler") may periodically compare the voltage on the capacitor to a reference voltage (and, e.g., output a one if the voltage on the capacitor exceeds the reference voltage or a zero if the voltage on the capacitor is less than the reference voltage). The finite state machine 215 may employ the resulting sequence of zeros and ones to send an appropriate duty cycle correction code to the duty cycle correction circuit 220. The duty cycle correction code may be a command to the duty cycle correction circuit 220 (e.g., a number written to a register in the duty cycle correction circuit 220) that causes the duty cycle correction circuit 220 to apply a specified duty cycle correction, as discussed in further detail below.

The system of FIG. 2A may face obstacles to effective implementation in serial data transmitters using high clock rates, because the input to charge-pump 212 toggles at the highest system clock rate. For example, if the first current source 235 and the second current source 240 are small, their fractional imbalance may be significant, and if they are large, it may be difficult to switch them at a high clock rate (and their power consumption may be excessive).

Figure 3A:
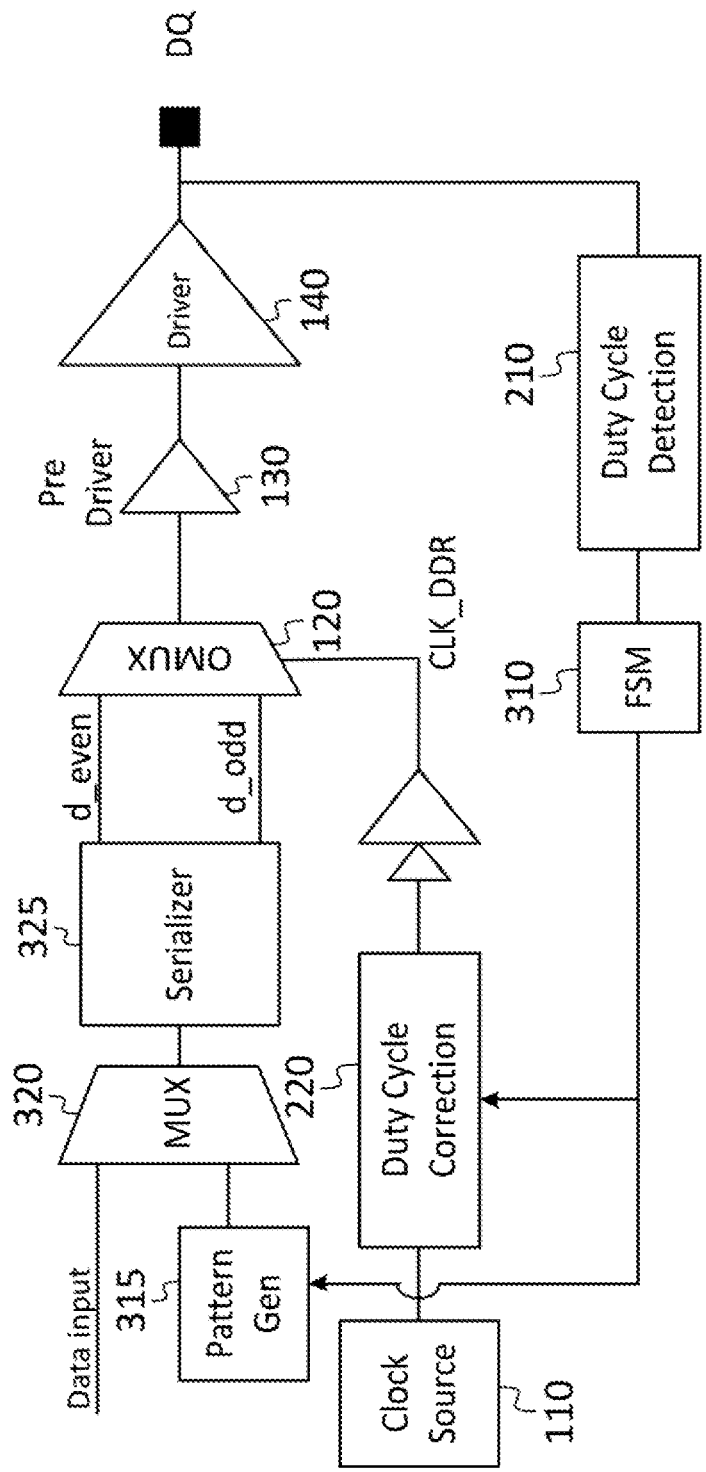
FIG. 3A is a block diagram of a system for duty cycle detection and correction, according to an embodiment of the present invention.
Figure 3B:
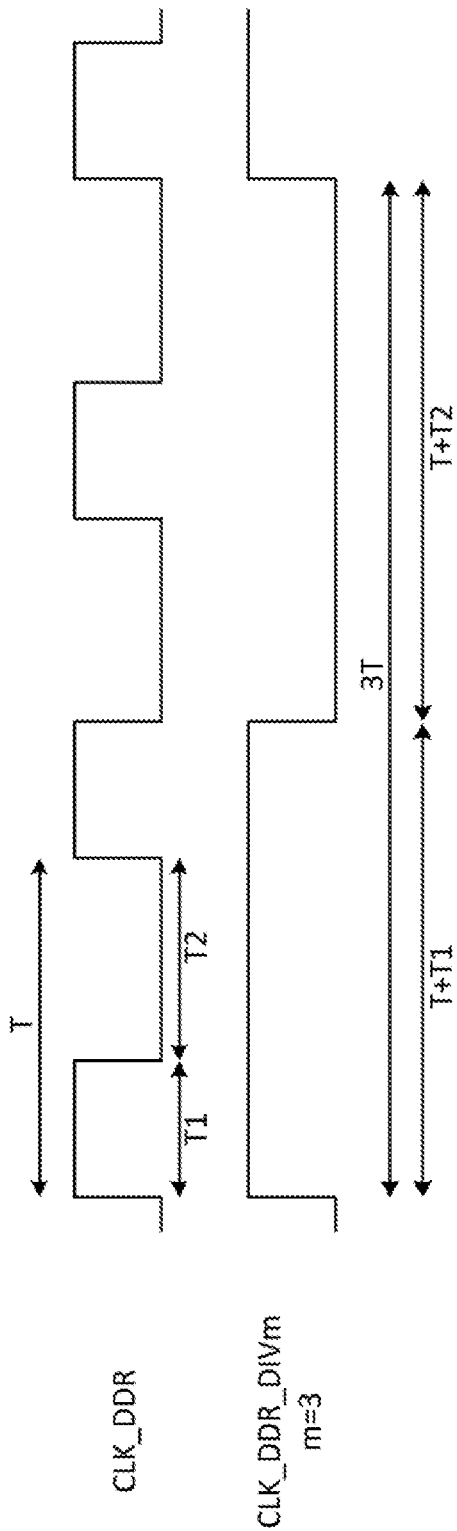
FIG. 3B is a waveform diagram, according to an embodiment of the present invention.

To address these challenges, a system like that illustrated in FIGS. 3A and 3B may be employed. In the embodiment of FIG. 3A, a finite state machine 310 is configured to operate at any time in one of two modes, a duty cycle calibration and correction mode, and a normal operating mode. In normal operating mode, the multiplexer 320 is controlled (e.g., by the finite state machine 310), to transmit data from the data input of the serial data transmitter (which in the embodiment of FIG. 3A includes the serializer 325, the OMUX 120, the pre-driver amplifier 130 and the driver amplifier 140).

In duty cycle calibration and correction mode the multiplexer 320 is instead controlled (e.g., by the finite state machine 310), to transmit data from a pattern generator 315 to the data input of the serial data transmitter, and the finite state machine 310 controls the pattern generator 315 to generate a pattern like the lower waveform of FIG. 3B, consisting of one or more sequences of bits, each of the sequences consisting of (i) an odd number of zeros followed by the same number of ones or (ii) an odd number of ones followed by the same number of zeros. As illustrated in FIG. 3B, if the duty cycle of the clock (the upper waveform of FIG. 3B) differs from 50%, then, because the numbers of zeros and ones are equal and odd, the duty cycle of the pattern generated by the pattern generator 315 will also differ from 50%, as illustrated in FIG. 3B, in which the odd number is three. The waveform of the output, when the pattern of FIG. 3B is transmitted, is lower in frequency (by a factor of the odd number, i.e., by a factor of three for the example of FIG. 3B) than the clock frequency; as a result it is less challenging for a switched charge pump in the duty cycle detection circuit 210 to operate at the frequency of the output, in this embodiment.

In some embodiments a system controller may periodically instruct the duty cycle detection and correction circuit (which, in FIG. 3A, includes the multiplexer 320, the pattern generator 315, the duty cycle detection circuit 210, the finite state machine 310, and the duty cycle correction circuit 220) to operate in duty cycle calibration and correction mode, e.g., by setting the select input of the multiplexer 320 so that the multiplexer 320 transmits the pattern generated by the pattern generator 315 to the input of the serial data transmitter, and asserting an enable input of the finite state machine 310. The system controller may arrange for operation in duty cycle calibration and correction mode upon startup and initialization of the system of which the serial data transmitter is an element. In a display the system controller may also, or instead, arrange for operation in duty cycle calibration and correction mode during a horizontal blanking period at the end of each displayed line or during a vertical blanking period at the end of each frame.

The system controller may be a simple state machine, within the finite state machine 310 or separate from the finite state machine 310, or the system controller may be a more complex processor (e.g., a stored-program computer) on the same integrated circuit as the serial data transmitter or on a separate integrated circuit. The finite state machine 310 may include a counter configured to count up when a bit received from the duty cycle detection circuit 210 has a first value, and to count down when a bit received from the duty cycle detection circuit 210 has a second value, different from the first value. The first value may be a binary one and the second value may be a binary zero, or vice versa. The output of the counter may be the duty cycle correction code sent to the duty cycle correction circuit 220; if the counter reaches a large positive (or negative) value, it may be an indication that the current duty cycle differs significantly from 50% and that therefore a significant change, to be produced by the duty cycle correction circuit 220, is appropriate.

The system of FIG. 3A may operate with two clock domains, one being the clock domain of the clock source (which may, for example, operate at a frequency greater than 1 GHz, e.g., at 5 GHz), and a second clock domain including circuits in the finite state machine 310, the pattern generator 315, and the duty cycle correction circuit 220 (except for the path that the clock signal from the clock source 110 takes through the duty cycle correction circuit 220). The second clock domain may use a significantly lower clock (e.g., with a frequency between 0.1 MHz and 100.0 MHz) which may be derived from (e.g., using a phase locked loop or frequency divider) the signal from the clock source 110, or independently generated (e.g., by an independent oscillator).

The duty cycle correction circuit 220 may include a chain of inverters (configured to switch at the frequency of the signal from the clock source 110) and a control circuit (which is part of the second clock domain) that adjusts the asymmetry of the inverters, in accordance with the duty cycle correction code that the duty cycle correction circuit 220 receives from the finite state machine 310. Each inverter may, for example, have a programmable pull-up strength or a programmable pull-down strength (or both). The pull-up strength may be made programmable, for example, by arranging for the inverter to include a plurality of pull-up transistors, each connected in series with a respective enabling transistor (the enabling transistors being switched on or off in accordance with the duty cycle correction code). The pull-down strength may be made programmable in an analogous manner.

In some embodiments, the effects of sources of error in the duty cycle detection and correction circuit are suppressed by first configuring the pattern generator 315 to generate a first pattern, and calculating a first duty cycle correction code based on the first pattern, and then generating a second pattern, the second pattern being the exact inverse of the first pattern (e.g., the second pattern having a zero wherever the first pattern has a one and the second pattern having a one wherever the first pattern has a zero) and calculating a second duty cycle correction code based on the second pattern. A third duty cycle correction code, calculated as the average of the first duty cycle correction code and the second duty cycle correction code, may then be fed to the duty cycle correction circuit 220.

In some embodiments the number of zeros (and ones) of the sequences produced by the pattern generator may vary with time, to distribute the spectral content of this signal into a larger number of narrowband spectral components. For example, the pattern generator 315 may include a 4-bit pseudorandom number generator (using, e.g., a 4-bit linear feedback shift register), the output of which, for each sequence to be produced, may be right-shifted by one, and then decremented by one to generate an odd number to be used in generating the sequence.

Figure 4:
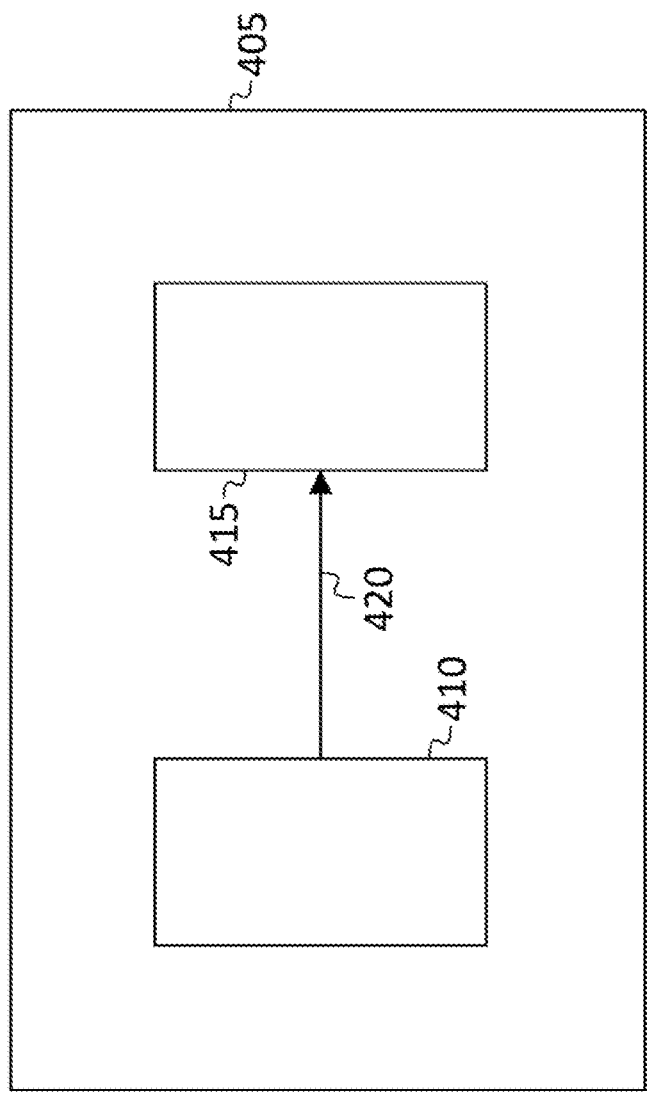
FIG. 4 is a block diagram of a display, according to an embodiment of the present invention.

Referring to FIG. 4, in one embodiment a display 405 contains a timing controller 410 configured to send high-speed digital data to a driver integrated circuit (driver IC) 415, over a serial data link 420. The timing controller 410 includes a serial data transmitter, at the transmitting end of the serial data link 420, constructed according to an embodiment of the present invention to mitigate the effects of duty cycle distortion.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a method and apparatus for duty-cycle correction of high speed I/O have been specifically described and illustrated herein, many modifications and variations will be apparent to those skilled in the art. Accordingly, it is to be understood that a method and apparatus for duty-cycle correction of high speed I/O constructed according to principles of this invention may be embodied other than as specifically described herein. The invention is also defined in the following claims, and equivalents thereof.

What is claimed is:

1. A circuit, comprising:
a serial data transmitter having a data input, a clock input, and an output;
a pattern generator having a pattern data output configured to be selectively connected to the data input of the serial data transmitter; and
a duty cycle detection circuit, connected to the output of the serial data transmitter,
the pattern generator being configured to produce a pattern comprising a plurality of sequences, each sequence including an odd number of consecutive zeros and a same odd number of consecutive ones,
the serial data transmitter being configured to transmit, during each half cycle of a double data rate clock received at the clock input of the serial data transmitter, a respective bit received at the data input of the serial data transmitter, and
the duty cycle detection circuit being configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

2. The circuit of claim 1, wherein the duty cycle detection circuit has a clock input and comprises:
a capacitor;
a switched charge pump; and
a clocked comparator,
the switched charge pump being configured:
to charge the capacitor when the output of the serial data transmitter is in a first state and
to discharge the capacitor when the output of the serial data transmitter is in a second state,
the clocked comparator being configured to compare a voltage on the capacitor and a reference voltage, at a sampling time defined by a transition in a clock signal at the clock input of the duty cycle detection circuit.

3. The circuit of claim 1, further comprising a multiplexer having a first input, a second input, and an output,
wherein the pattern generator is connected to the first input of the multiplexer, and the serial data transmitter is connected to the output of the multiplexer.

4. The circuit of claim 3, further comprising a duty cycle correction circuit having an adjusted clock output connected to the clock input of the serial data transmitter, the duty cycle correction circuit being configured:
to receive:
a clock signal, and
a duty cycle correction code; and
to produce, at the adjusted clock output, an adjusted clock signal, the adjusted clock signal having a duty cycle adjusted according to the duty cycle correction code.

5. The circuit of claim 4, further comprising a finite state machine circuit, configured:
to reset the duty cycle detection circuit;
to set the multiplexer to connect the pattern generator to the data input of the serial data transmitter;
to command the pattern generator to generate a first pattern; and
to generate a first duty cycle correction code based on one or more bits received from the duty cycle detection circuit.

6. The circuit of claim 5, wherein the finite state machine circuit comprises a counter configured:
to count up when a bit received from the duty cycle detection circuit has a first value, and
to count down when a bit received from the duty cycle detection circuit has a second value, different from the first value.

7. The circuit of claim 5, wherein the finite state machine circuit is further configured:
to command the pattern generator to generate a second pattern;
to generate a second duty cycle correction code based on one or more bits received from the duty cycle detection circuit; and
to feed, to the duty cycle correction circuit, a third duty cycle correction code, the third duty cycle correction code being an average of:
the first duty cycle correction code, and
the second duty cycle correction code.

8. The circuit of claim 4, wherein the duty cycle correction circuit comprises an inverter having a programmable pull-up strength or a programmable pull-down strength.

9. A circuit, comprising:
a serial data transmitter having a data input, a clock input, and an output;
a clock source; and
a duty cycle detection and correction circuit comprising a pattern generator configured to produce a pattern comprising a plurality of sequences, each sequence including an odd number of consecutive zeros and a same number of consecutive ones,
the serial data transmitter being configured to transmit, during each half cycle of a double data rate clock received at the clock input of the serial data transmitter, a respective bit received at the data input of the serial data transmitter,
the duty cycle detection and correction circuit being configured:
to estimate, from a signal at the output of the serial data transmitter when the pattern is fed to the data input of the serial data transmitter, an error in a duty cycle of a clock embedded in the signal at the output of the serial data transmitter, and
to form an adjusted clock signal from a clock signal produced by the clock source, the adjusted clock signal having a duty cycle adjusted to reduce the error.

10. The circuit of claim 9, wherein the duty cycle detection and correction circuit further comprises a duty cycle detection circuit connected to the output of the serial data transmitter,
wherein:
the pattern generator has a pattern data output configured to be selectively connected to the data input of the serial data transmitter; and
the duty cycle detection circuit is configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

11. The circuit of claim 10, wherein the duty cycle detection circuit has a clock input and comprises:
a capacitor;
a switched charge pump; and
a clocked comparator, the switched charge pump being configured:
to charge the capacitor when the output of the serial data transmitter is in a first state and
to discharge the capacitor when the output of the serial data transmitter is in a second state,
the clocked comparator being configured to compare a voltage on the capacitor and a reference voltage, at a sampling time defined by a transition in a clock signal at the clock input of the duty cycle detection circuit.

12. The circuit of claim 10, further comprising a multiplexer having a first input, a second input, and an output,
wherein the pattern generator is connected to the first input of the multiplexer, and the serial data transmitter is connected to the output of the multiplexer.

13. The circuit of claim 12, further comprising a duty cycle correction circuit having an adjusted clock output connected to the clock input of the serial data transmitter, the duty cycle correction circuit being configured:
to receive:
a clock signal, and
a duty cycle correction code; and
to produce, at the adjusted clock output, an adjusted clock signal, the adjusted clock signal having a duty cycle adjusted according to the duty cycle correction code.

14. The circuit of claim 13, further comprising a finite state machine circuit, configured:
to reset the duty cycle detection circuit;
to set the multiplexer to connect the pattern generator to the data input of the serial data transmitter;
to command the pattern generator to generate a first pattern; and
to generate a first duty cycle correction code based on one or more bits received from the duty cycle detection circuit.

15. The circuit of claim 14, wherein the finite state machine circuit comprises a counter configured:
to count up when a bit received from the duty cycle detection circuit has a first value, and
to count down when a bit received from the duty cycle detection circuit has a second value, different from the first value.

16. The circuit of claim 14, wherein the finite state machine circuit is further configured:
to command the pattern generator to generate a first pattern;
to generate a second duty cycle correction code based on one or more bits received from the duty cycle detection circuit; and
to feed, to the duty cycle correction circuit, a third duty cycle correction code, the third duty cycle correction code being an average of:
the first duty cycle correction code, and
the second duty cycle correction code.

17. The circuit of claim 13, wherein the duty cycle correction circuit comprises an inverter having a programmable pull-up strength or a programmable pull-down strength.

18. A display, comprising:
a driver integrated circuit comprising a serial data receiver; and
a timing controller comprising:
a serial data transmitter having a data input, a clock input, and an output;
a pattern generator having a pattern data output configured to be selectively connected to the data input of the serial data transmitter; and
a duty cycle detection circuit, connected to the output of the serial data transmitter,
the serial data transmitter being configured to transmit, during each half cycle of a double data rate clock received at the clock input of the serial data transmitter, a respective bit received at the data input of the serial data transmitter,
the pattern generator being configured to produce a pattern comprising a plurality of sequences, each sequence including an odd number of consecutive zeros and a same odd number of consecutive ones, and
the duty cycle detection circuit being configured to measure a difference between a first interval and a second interval, in a signal at the output of the serial data transmitter, the first interval corresponding to the odd number of consecutive zeros within the sequence and the second interval corresponding to the odd number of consecutive ones within the sequence.

19. The display of claim 18, wherein the duty cycle detection circuit has a clock input and comprises:
a capacitor;
a switched charge pump; and
a clocked comparator,
the switched charge pump being configured:
to charge the capacitor when the output of the serial data transmitter is in a first state and
to discharge the capacitor when the output of the serial data transmitter is in a second state,
the clocked comparator being configured to compare a voltage on the capacitor and a reference voltage, at a sampling time defined by a transition in a clock signal at the clock input of the duty cycle detection circuit.

20. The display of claim 19, further comprising a multiplexer having a first input, a second input, and an output,
wherein the pattern generator is connected to the first input of the multiplexer, and the serial data transmitter is connected to the output of the multiplexer.

* * * * *